United States Patent
Chase et al.

[11] Patent Number: 5,923,077
[45] Date of Patent: Jul. 13, 1999

[54] PASSIVE COMPONENT INTEGRATED CIRCUIT CHIP

[75] Inventors: John R. Chase, Logan, Utah; Bruce Leon Jeppesen, Chesterfield, Mo.

[73] Assignee: Bourns, Inc., Riverside, Calif.

[21] Appl. No.: 09/022,102

[22] Filed: Feb. 11, 1998

[51] Int. Cl.⁶ .......................... H01L 29/00; H01L 23/48; H01L 23/52

[52] U.S. Cl. .......................... 257/536; 257/774; 257/533

[58] Field of Search .................. 257/924, 774, 257/729, 724, 750, 758, 767, 693, 528, 538, 584, 532, 533, 536

[56] References Cited

U.S. PATENT DOCUMENTS

| | | | |
|---|---|---|---|
| 4,302,736 | 11/1981 | Kasanami et al. | 333/172 |
| 4,573,101 | 2/1986 | Takeno | 361/321 |
| 4,616,290 | 10/1986 | Watanabe et al. | 361/328 |
| 4,665,465 | 5/1987 | Tanabe | 361/306 |
| 4,746,557 | 5/1988 | Sakamoto et al. | 428/138 |
| 4,904,967 | 2/1990 | Morii et al. | 333/185 |
| 4,947,286 | 8/1990 | Kaneko et al. | 361/321 |
| 4,999,595 | 3/1991 | Azumi et al. | 333/184 |
| 5,034,709 | 7/1991 | Azumi et al. | 333/184 |
| 5,075,650 | 12/1991 | Okamura et al. | 333/177 |
| 5,173,670 | 12/1992 | Naito et al. | 333/184 |
| 5,197,170 | 3/1993 | Senda et al. | 29/25.42 |
| 5,357,227 | 10/1994 | Tonegawa et al. | 333/185 |
| 5,367,431 | 11/1994 | Kunishi et al. | 361/502 |
| 5,404,118 | 4/1995 | Okamura et al. | 333/175 |
| 5,412,357 | 5/1995 | Nakamura et al. | 333/181 |
| 5,530,411 | 6/1996 | Nakata et al. | 333/185 |
| 5,757,067 | 5/1998 | Kambara | 257/724 |

FOREIGN PATENT DOCUMENTS

| | | | |
|---|---|---|---|
| 61-74360 | 4/1986 | Japan | 257/536 |
| 1-211933 | 8/1989 | Japan | 257/532 |
| 3-104156 | 5/1991 | Japan | 257/536 |
| 4-64259 | 2/1992 | Japan | 257/536 |
| 2077496 | 12/1981 | United Kingdom | 257/533 |

*Primary Examiner*—Mahshid Saadat
*Assistant Examiner*—Jhihan B. Clark
*Attorney, Agent, or Firm*—Klein & Szekeres, LLP

[57] ABSTRACT

A passive component integrated circuit chip formed on an insulative substrate includes a first conductive metallic layer on a major surface of the substrate; a layer of dielectric material on top of the first conductive metallic layer; a second conductive metallic layer on top of the formation of dielectric material; a layer of insulative material on top of the layer of dielectric material and on and around the second conductive metallic layer, but not completely covering the second conductive metallic layer; a conductive via in contact with a portion of the second conductive metallic layer left uncovered by the layer of insulative material; a resistive layer on top of the layer of insulative material and in contact with the conductive via; a conductive contact in contact with the resistive layer; and a passivation layer on top of the resistive layer so as to provide a seal between the resistive layer and the conductive contact. Conductive end terminations are advantageously formed on the ends of the substrate to terminate selected conductive contacts and/or conductive metallic layers.

1 Claim, 1 Drawing Sheet

PASSIVE COMPONENT INTEGRATED CIRCUIT CHIP

BACKGROUND OF THE INVENTION

The present invention relates to an integrated circuit chip comprising two or more passive components (resistors and/or capacitors). More specifically, the present invention relates to a novel configuration and arrangement for the components in the chip, and to a novel method of fabricating the chip.

Currently, passive component integrated circuit chips that contain capacitors and resistors are configured with the capacitors and resistors in a side-by-side relationship. For example, a capacitor structure may be fabricated on an alumina substrate, and a resistor may be fabricated next to the capacitor structure. This results in either a relatively large surface area for the chip, or a low maximum capacitance value. Furthermore, the fabrication of the chip is complicated by the need to print the resistors around and/or between the capacitor(s).

It is therefore desired to provide a passive component integrated circuit chip that allows for a more compact structure (smaller surface area) and higher capacitance values than have heretofore been possible. It would also be desirable to simplify the fabrication process, thereby reducing the manufacturing cost of these devices.

SUMMARY OF THE INVENTION

The present invention is a passive component integrated circuit chip that employs a multilayer structure on an alumina substrate. In a chip containing an R-C network, a capacitor is fabricated first on the substrate, and then at least one resistor is fabricated on top of the capacitor. This results in an overall smaller surface area than would be occupied by the same components in a side-by-side configuration (as much as about a 45% decrease in total surface area), while maintaining or even increasing the maximum achievable capacitance value, since nearly all of the surface area of the substrate is available for the capacitor plates, thus allowing larger plates than in the side-by-side configuration). Furthermore, all materials used are commercially available thick film materials, thereby maintaining low cost. Finally, all thick film layers that form the capacitors and resistors are laid one on top of the other, whereby each layer provides a substantially flat surface for the application of the next layer, thereby simplifying the manufacturing process and lowering the manufacturing costs.

DETAILED DESCRIPTION OF THE INVENTION

Figure 1:
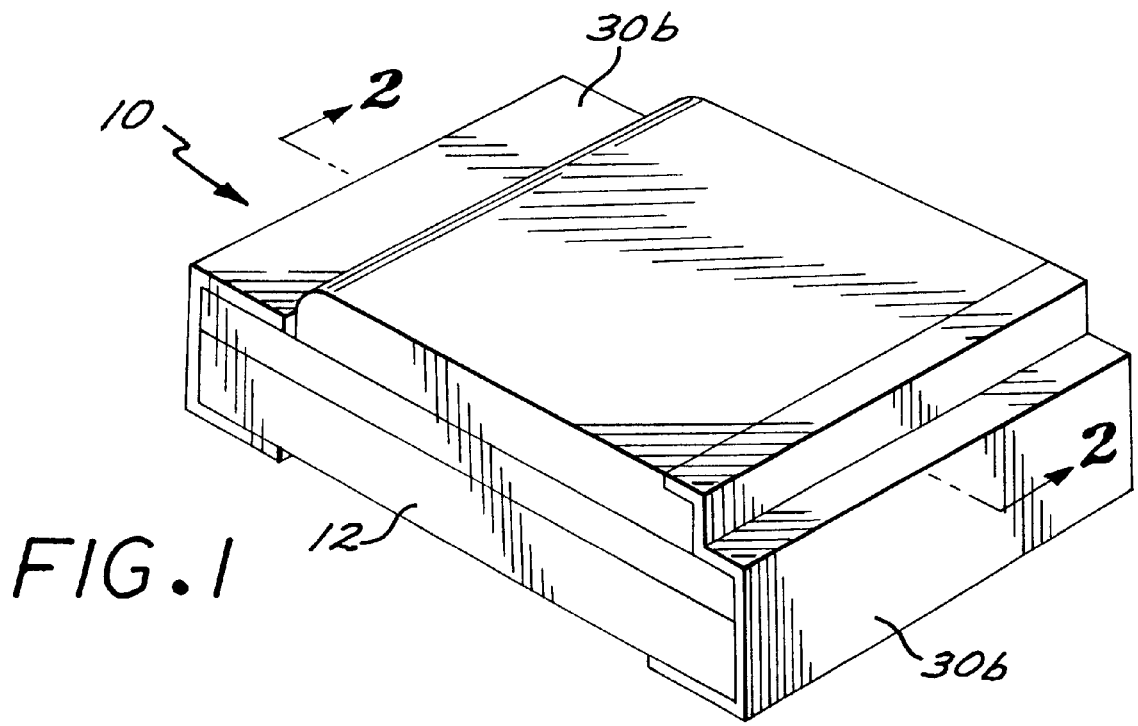
FIG. 1 is perspective view of a passive component integrated circuit chip constructed in accordance with a preferred embodiment of the present invention.

A passive component integrated circuit chip 10, in accordance with a preferred embodiment of the present invention, is shown in the drawings. The chip 10 includes a substrate 12, typically of alumina. Applied directly on a major surface of the substrate 12 is a first conductive metallic layer 14 that forms a first capacitor plate. First and second dielectric layers 16a, 16b are applied directly on top of the first conductive metallic layer 14. A second conductive metallic layer 18 is applied directly on top of the second dielectric layer 16b, forming a second capacitor plate. The first and second conductive metallic layers 14, 18 and the first and second dielectric layers 16a, 16b together form a capacitor structure.

First and second insulative sealing layers 20a, 20b are then applied on top of the second dielectric layer 16b, and on and around the second conductive metallic layer 18, but not completely covering it. A conductive metallic via 22 is then formed on the portion of the second conductive metallic layer 18 left uncovered by the insulative sealing layers 20a, 20b so as to establish a good electrical connection therewith. A thick film resistive element 24 is then applied on top of the second insulative sealing layer 20b and the via 22, whereby an electrical path is formed from the second conductive metallic layer 18 to the resistive element 24 through the via 22. Resistor contacts 26 are formed on either side of the resistive element 24 by the printing of a thick film conductor in the desired areas. A thick film glass passivation layer 28 is formed in top of the resistive element 24, forming a gas-impermeable seal between the resistive element 24 and the resistor contacts 26.

Figure 2:
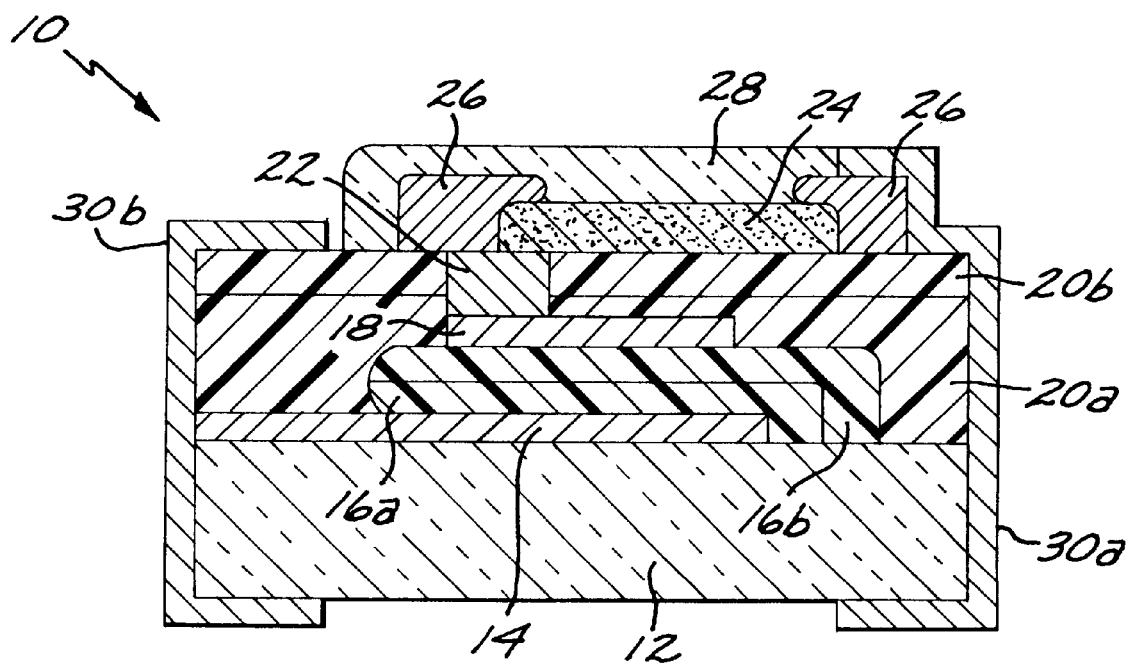
FIG. 2 is an idealized, semischematic cross-sectional view of the chip of FIG. 1, taken along line 2—2 of FIG. 1, with the internal structure enlarged to illustrate the detail.

First and second end terminations 30a, 30b may be formed on the substrate 12 so as to provide electrical terminals for appropriate conductive elements in the chip 10, depending on the circuit arrangement of the chip network. For example, in the specific embodiment shown in FIG. 2, which is a series R-C network, the first end termination 30a is connected to and terminates one of the resistor contacts 26, while the second end termination 30b is connected to and terminates the first conductive metallic layer 14. For the purposes of this specific embodiment, the first conductive metallic layer 14 extends all the way to one of the ends of the substrate 12, so that the second end termination 30b can be formed in contact with it, as described below.

In a specific preferred embodiment, the substrate 12 is 96% alumina ceramic, approximately 0.4–0.5 mm thick, with horizontal dimensions of about 2.0 mm by 1.3 mm. The first and second conductive metallic layers 14, 18 are formed of a silver- or silver/platinum-based thick film, such as Du Pont 5907, applied to a thickness of about 10–14 microns. The capacitive dielectric layers 16a, 16b are formed of a barium titanate thick film, such as Du Pont 5530 K2000, applied to a thickness of about 40–50 microns. The insulative sealing layers 20a, 20b are formed of a crystallizable thick film dielectric material, such as Du Pont QM-42, applied to a thickness of about 30–40 microns. The via 22 is a silver-based thick film conductor, such as Du Pont QS-171. The resistive element 24 is a ruthenium-based thick film resistive ink, such as Du Pont QM-83, applied to a thickness of about 13–16 microns. The resistor contacts 26 are formed of a silver- or silver/platinum-based thick film conductor, such as Dupont 5426, applied to a thickness of about 10–14 microns. The glass passivation layer 28 is formed of a lead borosilicate thick film glass, such as Du Pont 5436D, applied to a thickness of about 10–14 microns. All Du Pont materials are available from Du Pont Electronics, of Research Triangle Park, N.C.

The end terminations 30a, 30b may be made of nickel-plated silver or silver/palladium, with a second plating of solder. A preferred way of forming the end terminations 30a, 30b is to dip the ends of the substrate 12 into a silver- or a silver/palladium-based thick film paste, which is then cured and plated with the nickel and solder platings.

Suitable equivalents for the materials described above will be apparent to those skilled in the pertinent arts.

Furthermore, the dimensions given are exemplary only; other dimensions may be selected depending upon the desired physical and electrical characteristics of the chip module 10 and the network contained therein. In addition, although the preferred embodiment described herein has two capacitor dielectric layers 16a, 16b, and two insulative sealing layers 20a, 20b, a device may be made in accordance with the present invention having one or more capacitor dielectric layers and/or one or more insulative sealing layers.

The exemplary embodiment described above and shown in the drawings is in the configuration of a series R-C network. Similar materials and fabrication techniques may be employed to fabricate other RC or resistive networks in accordance with the present invention. In such other networks, the configuration, placement, and number of resistor contacts 26, and the configuration of the end terminations 30a, 30b, will depend upon the particular network involved.

These and other variations and modifications that may suggest themselves to those skilled in the pertinent arts are considered to be within the spirit and scope of the present invention.

What is claimed is:

1. An integrated passive component chip, comprising:

an insulative substrate;

a first conductive metallic layer on a major surface of the substrate;

a layer of dielectric material on top of the first conductive metallic layer;

a second conductive metallic layer on top of the formation of dielectric material;

a layer of insulative material on top of the layer of dielectric material and on and around the second conductive metallic layer, but not completely covering the second conductive metallic layer;

a conductive via in contact with a portion of the second conductive metallic layer left uncovered by the layer of insulative material;

a resistive layer on top of the layer of insulative material and in contact with the conductive via;

a conductive contact in contact with the resistive layer; and a passivation layer on top of the resistive layer so as to provide a seal between the resistive layer and the conductive contact.

* * * * *